US 6,641,406 B1

(12) United States Patent
Yatskov et al.

(10) Patent No.: US 6,641,406 B1
(45) Date of Patent: Nov. 4, 2003

(54) FLEXIBLE CONNECTOR FOR HIGH DENSITY CIRCUIT APPLICATIONS

(75) Inventors: Alexander I. Yatskov, Kenmore, WA (US); Stephen V. R. Hellriegel, Bainbridge Island, WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 09/705,368

(22) Filed: Nov. 3, 2000

(51) Int. Cl.⁷ .............................................. H01R 12/00
(52) U.S. Cl. ....................................................... 439/55
(58) Field of Search .............................. 439/55, 67, 77

(56) References Cited

U.S. PATENT DOCUMENTS

| 4,116,517 | A | | 9/1978 | Selvin et al. ............. 339/17 F |
| 4,125,310 | A | | 11/1978 | Reardon, II et al. ..... 339/92 M |
| 4,420,203 | A | | 12/1983 | Aug et al. ............... 339/17 CF |
| 5,307,561 | A | | 5/1994 | Feigenbaum et al. ......... 29/846 |
| 5,354,205 | A | | 10/1994 | Feigenbaum et al. ......... 439/67 |
| 5,364,277 | A | | 11/1994 | Crumly et al. ................ 439/67 |
| 5,929,521 | A | * | 7/1999 | Wark et al. ................. 257/737 |
| 6,118,080 | A | * | 9/2000 | Jiang et al. .................. 174/253 |
| 6,230,402 | B1 | * | 5/2001 | Sexton et al. ................ 29/846 |

FOREIGN PATENT DOCUMENTS

| EP | 0 106 990 | 5/1984 |
| FR | 2 643 754 | 8/1990 |
| WO | WO 88 05217 | 7/1988 |

* cited by examiner

*Primary Examiner*—Renee Luebke
*Assistant Examiner*—Ann Macamey
(74) *Attorney, Agent, or Firm*—Seed IP Law Group PLLC

(57) ABSTRACT

The flexible connector for high density circuit applications comprises a multilayer flexible substrate upon which are formed a plurality of contact pads, in a density required by a particular application. This density may exceed two hundred contact pads per square inch. Contact pads of similar size and configuration are formed on the surface of another device, i.e., circuit board, and provision made to align the contact pads of the connector with those of the circuit board. Micro-pads are formed on the surface of the contact pads on the connector such, that when the connector is brought into contact with the circuit board, and sufficient pressure is applied, the micro-pads make actual electrical contact with the pads of the circuit board. Since the total surface area in contact, namely the sum of the surface areas of the micropads, is a small fraction of the total area of the connector, a large pressure is provided at the electrical contact interface even when low pressure is provided to the connector as a whole.

28 Claims, 3 Drawing Sheets

FLEXIBLE CONNECTOR FOR HIGH DENSITY CIRCUIT APPLICATIONS

TECHNICAL FIELD

The present invention relates to the field of data transmission in high performance computer systems.

BACKGROUND OF THE INVENTION

In the field of computer processing, there are certain high performance computers that require multi-trace connector cables to carry signals and data from one location to another. Because of the circuit density of such machines, standard sockets and connectors are inadequate for the task, inasmuch as the number of individual electrical connections required on the circuit boards and modules would occupy an unacceptably large portion of the available space.

It is desirable that connectors used be capable of densities exceeding two or three hundred contacts per square inch of occupied space on the surface of a circuit board.

SUMMARY OF THE INVENTION

According to the principles of the present invention, micro bumps on the electrodes of an electrical connector are provided. The connector comprises a piece of flexible circuit material, of a size and shape required for the particular application. Disc-shaped electrodes are provided on the surface of the connector. Via the electrodes, the electrical connector carries the signals from a circuit board or other electronic device to another location, such as another circuit board. These electrodes are in electrical contact with electrical traces formed in various layers of the circuit material of the connector.

Each of the electrodes on the connector is provided with a plurality of tiny bumps, or micro-pads on its surface. Each electrode, having the plurality of micro-pads therein is a contact pad for carrying the electrical signal.

The circuit board or other electronic device is provided with a plurality of disc shaped contact pads, of a size and configuration that corresponds to that of the connector. The pads are formed concurrently with the formation of other features of the circuit board, by employing known manufacturing techniques.

When the connector is placed in correct alignment relative to the contact pads on the circuit board, and modest pressure is applied, solid electrical contact is achieved between each pad on the connector and each corresponding pad on the board via the micro bumps.

DETAILED DESCRIPTION OF THE INVENTION

Figure 1:
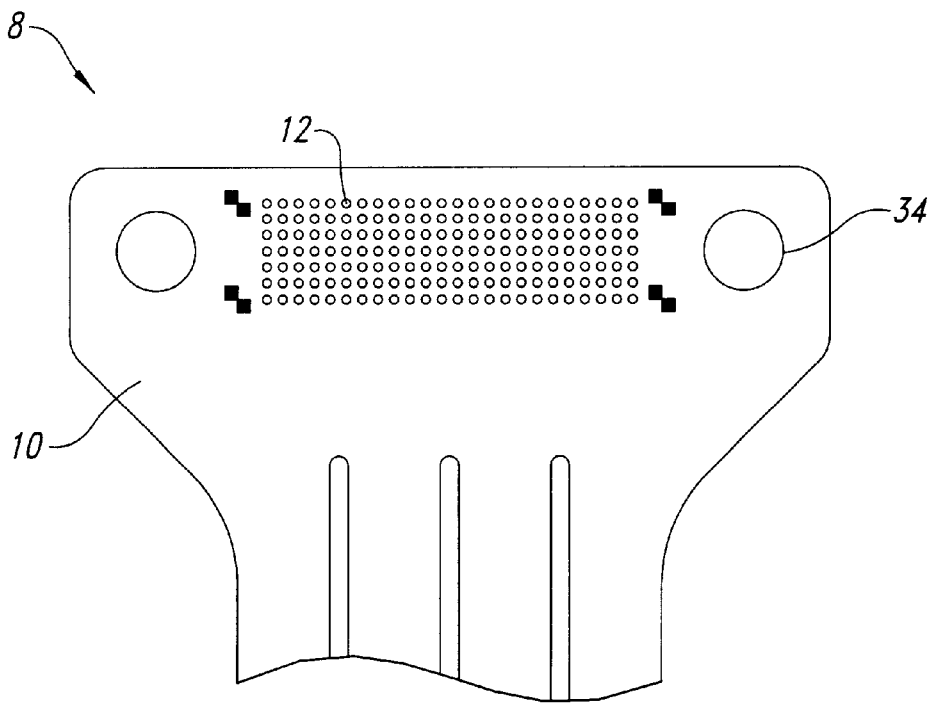
FIG. 1 is a plan view of the flexible connector according to one embodiment of the invention.

FIG. 1 shows an electrical connector 8. The electrical connector 8 includes a flexible circuit material 10 having contact pads 12 thereon. In one embodiment of the invention, this flexible substrate, or "flex" is a composite of materials commercially available, i.e., Dupont Pyralux Series. Contact pads 12 are provided on the surface of the flexible substrate and configured such that they correspond to a configuration of contact pads on the surface of a circuit board or other device to which the connection is to be made. When these two surfaces are correctly aligned and brought into contact, each pad on the electrical connector 8 makes direct contact with a corresponding pad on the circuit board.

In one embodiment of the invention, this alignment is achieved through the use of alignment holes 34 in the connector. These holes 34 are precisely positioned in relation to the contact pads 12, and correspond to alignment features on the circuit board. A variety of fasteners and methods of alignment between the electrical connection and circuit board may be designed for use with this invention, and variations in such fall within the scope of this invention.

The shape and size of the electrical connector 8 is determined by the specific application. The version shown in FIG. 1 represents one embodiment of this invention. Other applications will require other connector sizes and shapes, also within the scope of this invention.

In one embodiment of the invention, a plurality of flexible connectors are formed on a master sheet, then individually cut to the appropriate size and shape. In other embodiments of the invention the fasteners may be manufactured individually or concurrently with other devices. These are considered to be encompassed by the principles of the invention.

Figure 2:
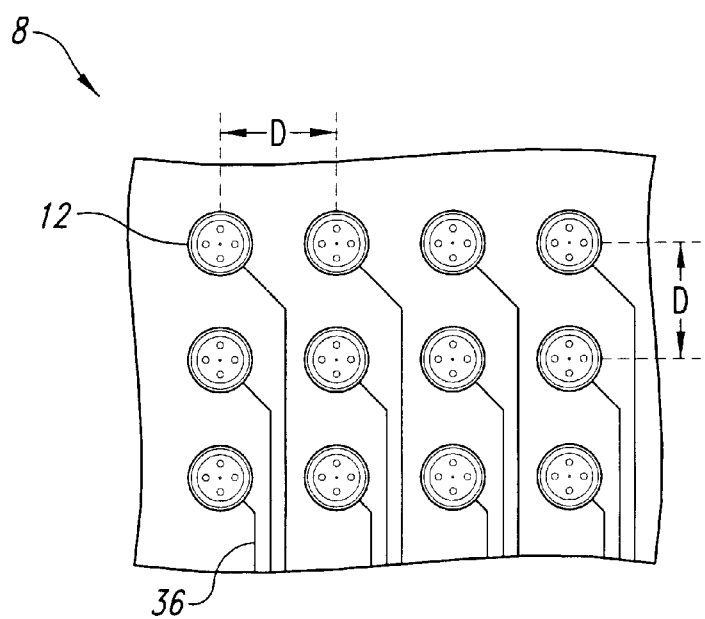
FIG. 2 is an enlarged view of a section of the flexible connector, showing the configuration of the contact pads, together with electrical traces.

FIG. 2 shows an enlarged view of a portion of the surface of the connector 8, on which the contact pads 12 are formed. According to one embodiment of the invention, the distance D between the pads is 0.05 inches, which achieves a density of 400 contacts per inch. Other configurations and densities are possible and may be preferable for specific applications.

Figure 3:
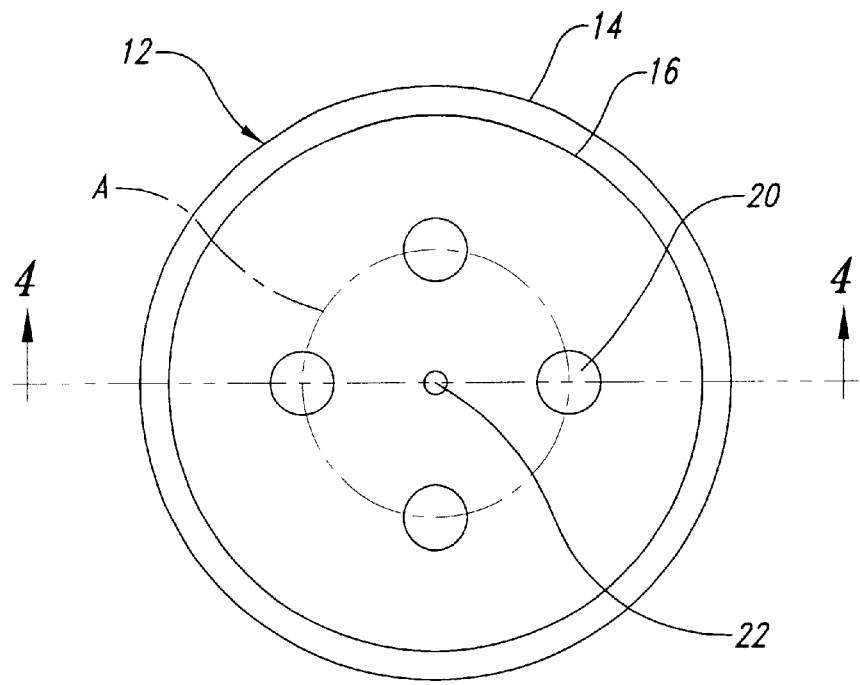
FIG. 3 is a plan view of a single contact pad on the flexible connector.

Electrical traces 36 are positioned on the electrical connector 8 to connect the pads 20 to other terminals and locations on the connector 8. FIG. 3 shows a plan view of a single contact pad 12. In one embodiment of the invention, the contact pads are round and have a diameter of 0.031 inches. Tiny bumps, also called micro-pads, 20 are provided on the surface of the contact pad 12, and comprise a part thereof. In one embodiment of the invention there are four such micro-pads, 0.004 inches in diameter, configured in a circle whose center is common with the center of the pad, and whose diameter A is 0.015 inches. In other embodiments of the invention the size or shape of the contact pads may vary, and the size shape or configuration of the micro-pads may vary. Such variations fall within the scope of this invention.

Figure 4:
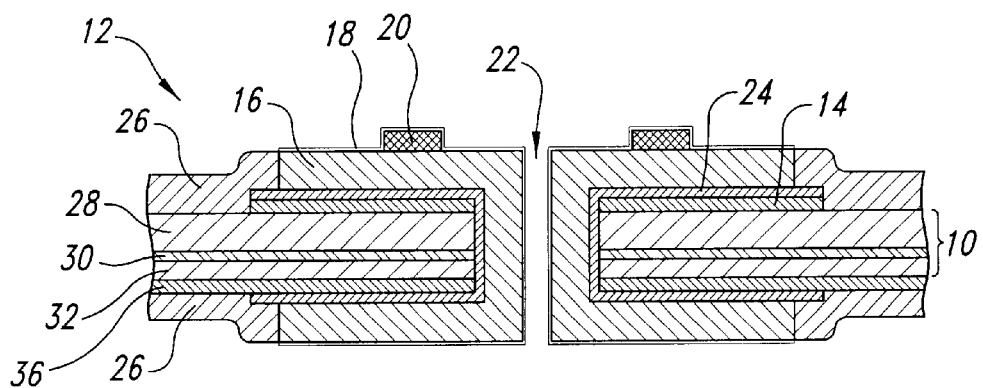
FIG. 4 is a cross section of a single contact pad, together with the underlying structure, along the line 4 of FIG. 3.

FIG. 4 shows a cross section view, at line 4 of FIG. 3, of a single contact pad 12, together with the flexible circuit material 10 upon which it is formed.

In one embodiment of the invention, a commercially available flexible circuit material is used. A first non-conductive substrate layer 28 is processed, using known methods, to form highly conductive pads 14 on its first surface. For example, non-conductive substrates can be purchased having highly conductive layers affixed to both sides thereof. These substrates can be purchased in various thicknesses, such as 0.001 inches, 0.002 inches, or any acceptable thickness. According to one technique, a commercial substrate is obtained having a conductive layer on both sides thereof. The conductive layer is then patterned and etched on each side, so as to form electrical traces at the desired locations. For example, one side thereof may become the ground plane and the other side thereof may be etched to form pad 14, and electrical traces connected thereto. The pads 14 may be copper and may have a thickness of 700 µinches. A second nonconductive substrate layer 32 is processed, using known methods, to form electrical traces 36 on its second surface. The traces may be copper and may have a thickness of 700 µinches. Using a non-conductive bonding layer 30, the first substrate layer 28 and the second substrate layer 32 are bonded together forming a composite flexible substrate, comprising the flexible circuit material 10. On those places where a grounding plane is desired, an electrically conducted ground plane may be present between first substrate layer 28 and second substrate layer 32. Connection to such a ground plane may be made by the same techniques by which connection is made to the electrical trace 36 as described later herein. Their positioning is such that the appropriate electrical traces 36 are directly opposite the corresponding pads 14. In various embodiments of the invention it is appropriate to form additional electrical traces on other surfaces or layers of the flexible circuit material. This may include the formation of electrical traces concurrently, and on the same surface as the conductive pads. In other embodiments of the invention additional substrate layers may be used to accommodate the trace pattern and density desired. The thickness of the individual substrate layers may be 0.001 inches, 0.002 inches, or any thickness or combination of thicknesses deemed appropriate.

According to one embodiment of the invention, holes 22 are drilled through the entire assembly, centered in each pad 14. The holes may have a diameter of 0.0065 inches. Using known processes, a highly conductive layer 24 is plated on the pads 14, the insides of the holes 22, and that part of the traces 36 that lies directly opposite the pads, providing an electrically conductive path from the pad 14 to the trace 36. This conductive layer may be copper or other conductor. Using known processes, a non-conductive cover layer 26 is applied to both surfaces of the substrate 10. The thickness of this layer is sufficient to provide insulation and protection from abrasion during normal handling and operation. This covers the traces 36 and the pads 14 as desired. According to one embodiment, this layer may have a thickness of 0.002 inches. An opening is provided in the layer 26 over the pad 14, centered over the hole 22. The opening may be produced by any appropriate techniques such as masking during formation, etching, milling, photo processing steps or the like.

The cover layer 26 forms a mask through which a conductive layer 16 is plated, primarily onto the surface of the preceding conductive plating 24. According to one embodiment of the invention, this layer is copper or copper alloy, and is coplanar with the surface of the cover layer 26.

Using known plating techniques, micro-pads 20 are formed on the conductive layer 16. The thickness of the micro-pads may be 0.001 inches. According to one embodiment of the invention, a finish layer 18 is formed on the surface of the plate layer 16 and the micro-pads 20. The finish layer 18 comprises three successive layers: 150 µinches of nickel, 15 µinches of palladium, and 3–7 µinches of gold in one embodiment. For example, one acceptable technique for forming micro-pads 20 is to provide a mask over each contact pad 12 and then, using appropriate electroplating techniques, plate the micro-pads 20 onto the conductive layer by electrical connection via the respective trace connected to the individual contact pads. An alternative technique is to form a layer thereover and then, using appropriate mask and etching techniques, remove the layer so as to provide the micro-bumps in the final shape as shown.

The diameter of the micro-pads is selected to provide good electrical contact under the appropriate pressure when the contact pad is acting as an electrode for connection to a printed circuit board. As a general rule, it will have a surface area considerably smaller than the surface area of the large contact pad. For example, the surface area of the micro-pads may be in the range of 1% to 5% of the surface area of the contact pad 12 thus providing correspondingly increasing pressure at their contact points than would be provided across the wide surface area of contact layer 12. They may also be provided in other shapes, such as pointed at the tapered square, cone shaped, pyramid shape, or other acceptable shapes for providing solid electrical contact.

Figure 5:
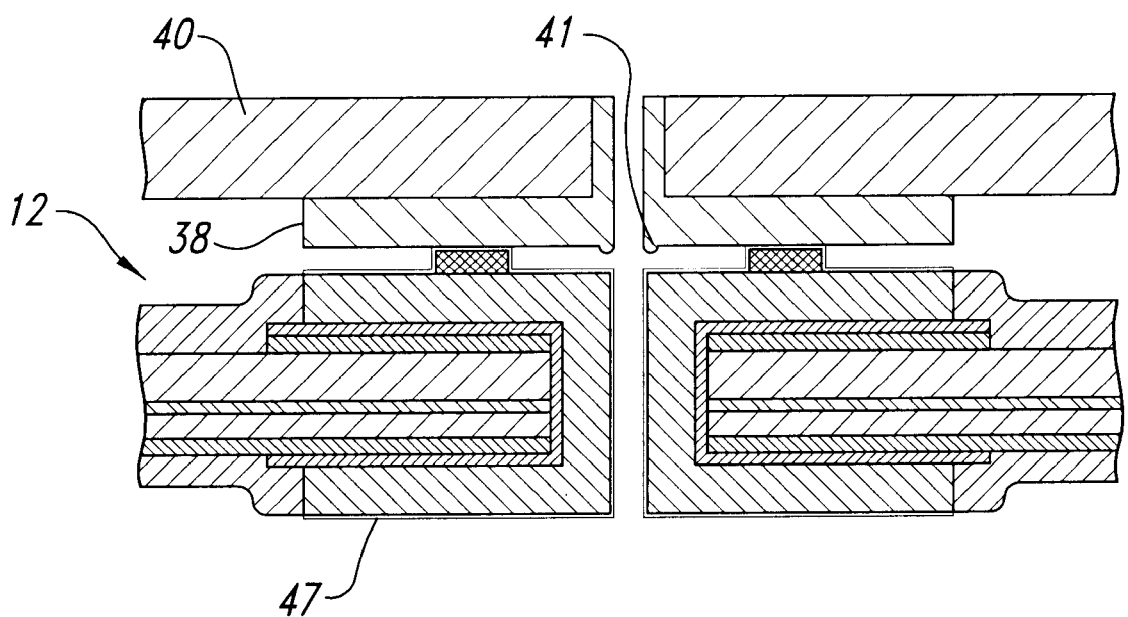
FIG. 5 shows a contact pad on a circuit board in electrical connection with the contact pad of the present invention.

FIG. 5 shows the individual contact pad 12 of FIG. 4, together with a contact pad 38 formed on a circuit board 40. According to the principles of this invention, contact pads are provided on the surface of the circuit board, in a size and configuration corresponding to those on the connector. These pads may be formed using the same processes as, and concurrently with, the formation of other features of the circuit board.

The contact pads 38 on the circuit board are produced according to known principles. In a common method of manufacture, a hole is drilled and plated to form the contact pad. A feature known in the industry as a knee 41 is formed on the edge of the hole during the plating process. This feature appears in FIG. 5 as a rise in the plate. The knee can interfere with a solid electrical connection by preventing the contact pads from making full contact. According to the principles of the invention, the use of micro-pads solves this problem by straddling the knee and allowing good contact between the respective contact pads.

The connector is aligned with the circuit board such that the contact pads 12 of the connector are in contact with the appropriate contact pads 38 of the circuit board 40, and sufficient pressure applied to ensure a solid connection. The micro-pads 20 may, in some instances, bite slightly into the contact pad 38 to provide a high quality, low resistance electrical connection. The traces 36 of the connector form conductive paths to electrically connect the circuit board to other electronic devices. These may include other circuit boards, modules, printers, computers etc. The connection with these other devices may be made by any means appropriate for the application, including conventional connectors, or some embodiment of this invention. may be made by any means appropriate for the application, including conventional connectors, or some embodiment of this invention.

It should be noted that, according to the embodiment described, the surface 47 of the connector directly opposite the primary face of contact pad 12 forms a contact pad which, when the connector is in place on the circuit board 40, is in electrical continuity with the contact pad 38. Another connector, stacked on surface 47 would make contact, through the first connector, with the circuit board 40. This feature allows the designer the liberty of using multiple connectors at the same site, permitting greater trace density or connection to multiple devices.

The current carrying requirement of the connectors is low as compared to that needed to power a computer. An important factor to consider is the security and dependability of the contacts. If the pressure between a flat contact pad of the connector and those of the circuit board is inadequate, the result may be either intermittent opening of the contact, which would interfere with the transmission of data, or increased resistance at the point of connection, raising the total impedance of the circuit to an unacceptable level. The design of fasteners and hardware used to exert force adequate to press the contacts of the connector onto those of the circuit board is an important consideration. The use of micro-pads 20 on the surface of the contacts on the connector can significantly reduce the pressure requirements on the board as a whole while providing higher pressure at the actual points of contact, thus making possible the use of lighter, smaller fasteners in high density applications.

For example, it may be desired in some designs that 50 pounds of pressure per square inch is required on each contact to assure a solid connection. Assuming a density of 400 contacts per square inch and a diameter of 0.03 inches per contact, then using smooth contacts the total surface area of the contacts would be 0.28 square inches per square inch of connector. This would require 14 pounds of pressure per square inch of connector. In contrast, by incorporating the micro-pads 20 on the surface of the connectors, the surface area is reduced significantly. One embodiment of the invention employs four micro-pads per contact, with a diameter of 0.003 inches each. In other applications, the micro-pads may be 0.001 to 0.01 inches in diameter. If one assumes the same density of contacts, the total surface area is 0.011 square inches per square inch of connector. To achieve the same security in the connection, the required pressure becomes 0.57 pounds of pressure per square inch. A fastener capable of exerting 14 pounds of pressure psi, evenly across hundreds of contacts is more complex and far bulkier than one requiring little more than half a pound.

The figures described in the above calculations represent a single possible embodiment of this invention. In other applications the current carrying requirements might be different, or the contact density could vary, but it is clear from the foregoing that the use of micro-pads provides a considerable advantage, and any such use is within the scope of this invention.

The use of the term circuit board in the foregoing description is for convenience only, and includes a broad range of electrical products. The connector and method described herein may be used to connect to any electronic device including circuit boards, modules, other connectors, peripheral devices etc.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
   a non-conductive flexible substrate;
   a contact pad on a first level of the substrate;
   an electrically conductive trace formed at a second level of the substrate and positioned proximate to the contact pad;
   an electrically insulating layer positioned between the conductive trace and the first surface having the contact pad thereon;
   a conductively plated through hole, positioned in the approximate center of the contact pad and providing electrical continuity between the contact pad and the trace; and
   a plurality of micro-pads on the contact pad, each of the micro-pads having a substantially flat and coplanar top surface.

2. The apparatus according to claim 1, wherein said apparatus comprises an electrical connector assembly.

3. The apparatus according to claim 1, wherein the micro-pads are of a selected size and shape and thickness.

4. The apparatus according to claim 1, wherein said plurality of micro-pads is equal to four.

5. The apparatus according to claim 1, wherein said contact pad is one of a plurality of contact pads formed on the first level of said substrate.

6. The apparatus according to claim 1 wherein the micro-pads are electroplated onto the conductive pads.

7. The apparatus according to claim 1 in which the conductive pad is composed of a plurality of conductive layers.

8. The apparatus according to claim 1, wherein said micro-pads are formed on a first surface of said contact pad, comprising a part thereof.

9. The apparatus according to claim 8, wherein the plurality of micro-pads are selected to have a total surface area of approximately 1% to 5% of the surface area of the contact pad.

10. The apparatus according to claim 8, wherein said contact pad has a nominal diameter of 0.031 inches, and a nominal thickness of 0.0032 inches.

11. The apparatus according to claim 8, wherein each of said plurality of micro-pads have a nominal diameter of 0.003 inches, and a nominal thickness of 0.001 inches.

12. The apparatus according to claim 1, wherein center points of each of said plurality of micro-pads are spaced evenly around a common circle.

13. The apparatus according to claim 12, wherein said common circle shares a center point with said contact pad.

14. The apparatus according to claim 13, wherein said common circle has a nominal diameter of 0.014 inches.

15. The apparatus according to claim 1, wherein said electrically conductive trace is one of a plurality of electrically conductive traces.

16. The apparatus according to claim 15, wherein each of said plurality of electrically conductive traces are formed on one of a first surface of said non-conductive substrate, a second surface of said non-conductive substrate, an internal layer of said non-conductive substrate, or any combination thereof.

17. The apparatus according to claim 15, wherein each of said plurality of said contact pads is in electrical continuity with a corresponding individual one of said plurality of traces.

18. An electrical connection, comprising:
   a first non-conductive flexible substrate;
   a first plurality of contact pads on a first surface of the first substrate, each having a conductively plated through hole, positioned in the approximate center of the contact pad and passing through the flexible substrate;
   a second non-conductive substrate;
   a plurality of terminal pads on a first surface of the second substrate, the plurality of terminal pads being positioned with each one of the plurality of terminal pad in electrical contact with a respective one of the plurality of contact pads on the first substrate;
   a plurality of micro-pads on each one of the plurality of contact pads and forming a part thereof, each of the plurality of micro-pads having a substantially flat and coplanar upper surface, the micro-pads being positioned such that the upper surfaces of the micro-pads are the only part of the contact pads in electrical contact with the terminal pads; and the contact pads and terminal pads being structured such that the electrical contact may be made and unmade repeatedly without substantial deformation to either the terminal pads or the contact pads.

19. The electrical connection of claim 18, wherein the plurality of micro-pads have sidewalls that are substantially perpendicular to the first surface of the first non-conductive substrate.

20. The electrical connection of claim 18, further including alignment means for maintaining the first substrate and the second substrate in a position such that the terminal pads and contact pads are in a position to contact each other during repeated connection and disconnection.

21. The electrical connection of claim 18, further including pressure means for pressing the contact pads and the terminal pads together.

22. The electrical connection of claim 18, wherein a plurality of electrically conductive traces are formed on one of the first surface of the first non-conductive connector substrate, a second surface of the first substrate, an internal layer of the first substrate, or any combination thereof, each one of the plurality of traces electrically connected to a respective one of the plurality of contact pads, and wherein those of the plurality of traces not formed on the first surface of the substrate are electrically connected to the respective contact pad by the corresponding electrically plated through hole.

23. The electrical connection of claim 18 wherein the first plurality of contact pads is arranged on the first surface of the first substrate in rows and columns of more than two rows and more than two columns, having an overall density of about four-hundred pads per square inch.

24. The electrical connection of claim 18, further comprising a second plurality of contact pads positioned on a second surface of the first substrate such that each one of the second plurality of contact pads is located directly opposite one of the first plurality of contact pads, and electrically connected with the same one of the first plurality of contact pads via the corresponding through hole.

25. The electrical connection of claim 24, further comprising:
a third non-conductive substrate;
a third plurality of contact pads on a first surface of the third substrate the third plurality of contact pads having a positional relationship with the second plurality of contact pads such, that each one of the third plurality of contact pads is in electrical contact with a respective one of the second plurality of contact pads.

26. An electrical connection, comprising:
a first non-conductive substrate;
a first plurality of contact pads on a first surface of the first substrate;
a second non-conductive substrate;
a plurality of terminal pads on a first surface of the second substrate, the plurality of terminal pads being positioned with each one of the plurality of terminal pad in electrical contact with a respective one of the plurality of contact pads on the first substrate;
a plurality of micro-pads on each one of the plurality of contact pads and forming a part thereof, the micro-pads being positioned such that the upper surfaces of the micro-pads are the only part of the contact pads in electrical contact with the terminal pads; and
a second plurality of contact pads positioned on a second surface of the first substrate such that each one of the second plurality of contact pads is located directly opposite one of the first plurality of contact pads, and electrically connected with the same one of the first plurality of contact pads.

27. The electrical connection of claim 26, further comprising:
a third non-conductive substrate;
a third plurality of contact pads on a first surface of the third substrate the third plurality of contact pads having a positional relationship with the second plurality of contact pads such, that each one of the third plurality of contact pads is in electrical contact with a respective one of the second plurality of contact pads.

28. A connector, repositionable with respect to a receptacle, comprising:
a flexible substrate;
a plurality of individual contact pads;
a plurality of micro-pads formed on each of the plurality of contact pads, each of the micro-pads having a flat upper surface; and
an additional plurality of contact pads positioned on a second surface of the flexible substrate such, that each one of the additional plurality of contact pads is located directly opposite one of the plurality of contact pads, and electrically connected with the same one of the plurality of contact pads.

* * * * *